United States Patent
Hamada et al.

(10) Patent No.: US 6,348,427 B1
(45) Date of Patent: Feb. 19, 2002

(54) HIGH-THERMAL-EXPANSION GLASS CERAMIC SINTERED PRODUCT

(75) Inventors: Noriaki Hamada; Hideto Yonekura; Kenichi Nagae; Youji Furukubo; Yoshihiro Nakao; Masahiko Higashi, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/495,567

(22) Filed: Feb. 1, 2000

(30) Foreign Application Priority Data

| Feb. 1, 1999 | (JP) | ................... 11-024423 |
| Feb. 1, 1999 | (JP) | ................... 11-024424 |
| Oct. 29, 1999 | (JP) | ................... 11-309641 |

(51) Int. Cl.$^7$ ............................................. C03C 1/00
(52) U.S. Cl. .............................. 501/32; 501/72; 501/73
(58) Field of Search ............................... 501/32, 72, 73

(56) References Cited

U.S. PATENT DOCUMENTS

| 4,624,934 A | * | 11/1986 | Kokubu et al. | ............... 501/17 |
| 4,714,687 A | * | 12/1987 | Holleran et al. | ............... 501/9 |
| 4,777,092 A | * | 10/1988 | Kawakami et al. | ......... 428/428 |
| 4,814,298 A | * | 3/1989 | Nelson et al. | ................. 501/17 |
| 4,883,705 A | * | 11/1989 | Kawakami et al. | ......... 428/209 |
| 4,961,998 A | * | 10/1990 | Senkalski et al. | ........... 428/426 |
| 5,304,518 A | * | 4/1994 | Sunahara et al. | ............. 501/62 |
| 5,763,339 A | * | 6/1998 | Asada et al. | .................. 501/17 |
| 6,132,832 A | * | 10/2000 | Crichton et al. | .............. 428/49 |

* cited by examiner

*Primary Examiner*—Cathy Lam
(74) *Attorney, Agent, or Firm*—Hogan & Hartson, LLP

(57) ABSTRACT

A glass ceramic sintered product obtained by sintering a mixture powder containing a BaO-containing glass, metal oxide particles having a coefficient of linear thermal expansion at 40 to 400° C. of not smaller than 6 ppm/°C., and a Zr compound and, particularly, containing the Zr compound in an amount of from 0.1 to 30% by weight calculated as $ZrO_2$, and exhibiting a coefficient of linear thermal expansion at 40 to 400° C. of from 8.5 to 18 ppm/°C. The glass ceramic sintered product exhibits excellent resistance against chemicals and does not discolor even when subjected to treatment with an acidic or alkaline solution in the step of plating. A wiring board using the glass ceramic sintered product as an insulating substrate exhibits a coefficient of linear thermal expansion substantially similar to that of an external circuit board, effectively suppressing the occurrence of thermal stress and cracking.

5 Claims, 1 Drawing Sheet

FIG.1

HIGH-THERMAL-EXPANSION GLASS CERAMIC SINTERED PRODUCT

BACKGROUND OF THE INVENTION

1. Field of the Invention

The present invention relates to a glass ceramic sintered product having a highly thermally expanding property. More particularly, the invention relates to a glass ceramic sintered product useful as an insulating substrate for preparing a wiring board used in a package for containing a semiconductor.

2. Description of the Prior Art

A wiring board used for various kinds of electronic circuit parts has a structure in which a metallized wiring layer is formed on the surface or inside of the insulating substrate. A representative example of the electronic circuit part equipped with the wiring board may be a semiconductor device-containing package containing a semiconductor device such as LSI (large-scale integrated circuit device).

In such a semiconductor device-containing package, in general, a semiconductor device is mounted on the surface of a ceramic insulating board such as of alumina ceramic, a metallized wiring layer such as of W or Mo is formed on the surface or inside of the insulating substrate, a plurality of connection pads are formed on the back surface of the insulating substrate being connected to the metallized wiring layer, and connection terminals are attached to the connection pads for making connection to the external circuit board. Further, the semiconductor device mounted on the surface of the insulating substrate is connected to the metallized wiring layer through wires and is air-tightly sealed with a closure.

The above-mentioned semiconductor device-containing package is mounted on an external circuit board by electrically connecting the connection terminals attached to the connection pads on the back surface of the insulating substrate to the wiring conductors of the external circuit board by soldering or the like method.

Here, however, an increase in the degree of integration of the semiconductor device is accompanied by an increase in the number of electrodes formed on the semiconductor device and by an increase in the number of connection terminals of the package that contains the semiconductor device. In practice, however, it has been desired to realize the semiconductor device-containing package in a small size, and limitation is imposed on increasing the size of the package despite of an increase in the number of electrodes of the semiconductor device. It has therefore been urged to form a number of connection terminals on a more compact semiconductor device-containing package, i.e., to enhance the density of the connection terminals.

As packages having highly densely arranged connection terminals, there have heretofore been known a pin grid array (PGA) having metal pins such as of Kovar connected to the back surface (lower surface) of a insulating substrate, a quad flat package (QFP) having a structure in which metal pins of the shape of a gull-wing (L-shape) are drawn from all of the four side walls of the package, and a ball grid array (BGA) comprising ball terminals which are connection terminals formed of a brazing material such as solder. Among them, it has been said that the BGA is most suited for highly densely arranging the connection terminals.

In the above-mentioned ball grid array (BGA), the ball terminals of a brazing material are brought into contact with the wiring conductor of the external circuit board, and are heated and melted at a temperature of from about 250 to about 400° C. and are joined to the wiring conductor so as to effect the mounting on the external circuit board. Owing to such a mounting structure, the electrodes of the semiconductor device mounted on the semiconductor device-containing package are electrically connected to the external circuit board through the metallized wiring layer and the connection terminals.

Ceramics such as alumina and mullite have heretofore been used as a ceramic insulating substrate have a strength of as high as 200 MPa or more, and are useful from the standpoint of forming a laminated layer structure together with the metallized wiring layer maintaining high reliability. These ceramics, however, have a defect in that their coefficients of thermal expansion are as low as from about 4 to about 7 ppm/°C. That is, a printed board having a Cu wiring layer formed on a glass-epoxy insulating layer has been most widely used as an external circuit board on which a package will be mounted. This printed board has a coefficient of thermal expansion of as very large as from 11 to 18 ppm/°C. Therefore, when the semiconductor device-containing package is mounted on the external circuit board such as the printed board, heat generated by the operation of the semiconductor device is applied to both the insulating substrate and the external circuit board, resulting in the occurrence of thermal stress due to a difference in the thermal expansion between the insulating substrate and the external circuit board. As a result, the thermal stress affects the connection portion between the insulating substrate and the external circuit board, giving rise to the occurrence of cracks and peeling of the connection terminals, making it difficult to stably maintain the package electrically connected to the external circuit board for extended periods of time.

The present inventors therefore have previously proposed a glass ceramic sintered product obtained by mixing, with a predetermined filler, a glass containing BaO in an amount of from 15 to 60% by weight and having a low softening point and a highly thermally expanding property, and firing the mixture. The insulating substrate formed of this glass ceramic sintered product has a large coefficient of thermal expansion. Therefore, the wiring board equipped with this insulating board effectively prevents the occurrence of cracks or peeling of the connection terminals caused by the thermal stress, and makes it possible to stably maintain the electric connection between, for example, the semiconductor device-containing package and the external circuit board for extended periods of time.

However, the above BaO-containing glass ceramic sintered product has poor resistance against the chemicals, and is discolored when it is treated with an acidic solution or an alkaline solution used in the step of plating. Further, when a metallized wiring layer of a low-resistance metal such as copper is formed by co-firing on the surface of the insulating substrate formed of the glass ceramic sintered product, there arouses a problem in that the metallized wiring layer loses the strength of adhesion.

SUMMARY OF THE INVENTION

The object of the present invention, therefore, is to provide a high-thermal-expansion glass ceramic sintered product formed by using a BaO-containing glass and having excellent resistance against the chemicals, and a method of producing the same.

Another object of the present invention is to provide a wiring board comprising an insulating substrate of the glass ceramic sintered product and a metallized wiring layer formed on the surface or inside of the insulating substrate, featuring improved adhesion between the metallized wiring layer and the insulating substrate.

A further object of the present invention is to provide a structure for mounting the wiring board (particularly, a semiconductor device-containing package) maintaining a strong and stable connection to the external circuit board that contains an organic resin for extended periods of time.

According to the present invention, there is provided a high-thermal-expansion glass ceramic sintered product comprising:

(A) a glass phase which contains BaO in an amount of from 5 to 60% by weight; and (B) a filler phase containing metal oxide particles having a coefficient of linear thermal expansion at 40 to 400° C. of not smaller than 6 ppm/°C.;

wherein said sintered product contains:

(C) a Zr element in an amount of from 0.1 to 30% by weight calculated as $ZrO_2$, and has a coefficient of linear thermal expansion at 40 to 400° C. of from 8.5 to 18 ppm/°C.

According to the present invention, there is further provided a method of producing a glass ceramic sintered product comprising preparing a mixture which contains a glass powder containing BaO in an amount of from 5 to 60% by weight, a metal oxide powder having a coefficient of linear expansion at 40 to 400° C. of not smaller than 6 ppm/°C., and a Zr element in an amount of from 0.1 to 30% by weight calculated as $ZrO_2$, and molding said mixture into a predetermined shape followed by firing at 800 to 1100° C.

According to the present invention, there is further provided a wiring board comprising an insulating substrate formed of the glass ceramic sintered product and a metallized wiring layer formed on the surface or inside of said insulating substrate.

The invention further provides a structure for mounting the wiring board, wherein the wiring board is placed on an external circuit board having a wiring conductor formed on an insulating layer containing an organic resin, and the connection terminals of said wiring board are joined by brazing to said wiring conductor, said wiring board having a semiconductor device air-tightly sealed in the surface of said insulating substrate, and having connection terminals on the back surface of said insulating substrate so as to be electrically connected to said semiconductor device.

If briefly described, the glass ceramic sintered product of the present invention is obtained by firing a BaO-containing glass powder and a filler powder containing metal oxide particles having a coefficient of linear thermal expansion at 40 to 400° C. of not smaller than 6 ppm/°C., and has a highly thermally expanding property. What is particularly important here is that the glass ceramic sintered product contains a Zr element in an amount of from 0.1 to 30% by weight calculated as $ZrO_2$. That is, upon containing the Zr element in a predetermined amount, the glass ceramic sintered product of the invention exhibits excellent resistance against the chemicals and is not discolored even when it is treated with an acidic solution or an alkaline solution in, for example, a step of plating. A sintered product containing the above Zr element, the BaO-containing glass and metal oxide particles having a large coefficient of linear thermal expansion, exhibits a coefficient of linear thermal expansion at 40 to 400° C. of from 8.5 to 18 ppm/°C. Therefore, the wiring board using the glass ceramic sintered product as an insulating substrate exhibits a coefficient of linear thermal expansion which is close to the coefficient of linear thermal expansion (e.g., 11 to 18 ppm/°C.) of the external circuit board such as the printed board. There is thus obtained a mounting structure which effectively suppresses the occurrence of thermal stress caused by a difference in the thermal expansion between the two, and effectively prevents the occurrence of cracks or peeling of the connection terminals at the connection portion between the two. Further, the insulating substrate has the coefficient of linear thermal expansion close to the coefficient of linear thermal expansion of the metallized wiring layer of a low-resistance conductor formed on the surface or inside thereof (copper has a coefficient of linear thermal expansion of 18 pm/°C.). This enhances the adhesion between the metallized wiring layer and the insulating board.

Upon containing the Zr element, further, an unexpected advantage is accomplished such as suppressing the precipitation of cristobalite. That is, the starting glass powder of the glass ceramic sintered product usually contains an $SiO_2$ component which causes cristobalite to be partly precipitated at the time of sintering. The sintered product precipitating the cristobalite has a point of inflection on a curve of the coefficient of linear thermal expansion at 40 to 400° C. Therefore, the wiring board having the insulating substrate formed by using the above sintered product involves a problem in that microcracks develop in the insulating substrate due to heat impairing the properties of the wiring board. For example, when the semiconductor device-containing package having the semiconductor device placed on the wiring board, is mounted on an external circuit board such as printed board, a difference in the size increases between the region where the cristobalite crystals have precipitated in the insulating substrate and the region where they were not precipitated due to heat generated by the operation of the semiconductor device, giving rise to the occurrence of microcracks in the insulating substrate. On the other hand, the glass ceramic sintered product of the present invention in which the Zr element is made present, suppresses the precipitation of cristobalite. Therefore, the wiring board equipped with the insulating substrate formed of the sintered product effectively prevents the occurrence of microcracks in the insulating substrate.

DETAILED DESCRIPTION OF THE INVENTION

Figure 1:
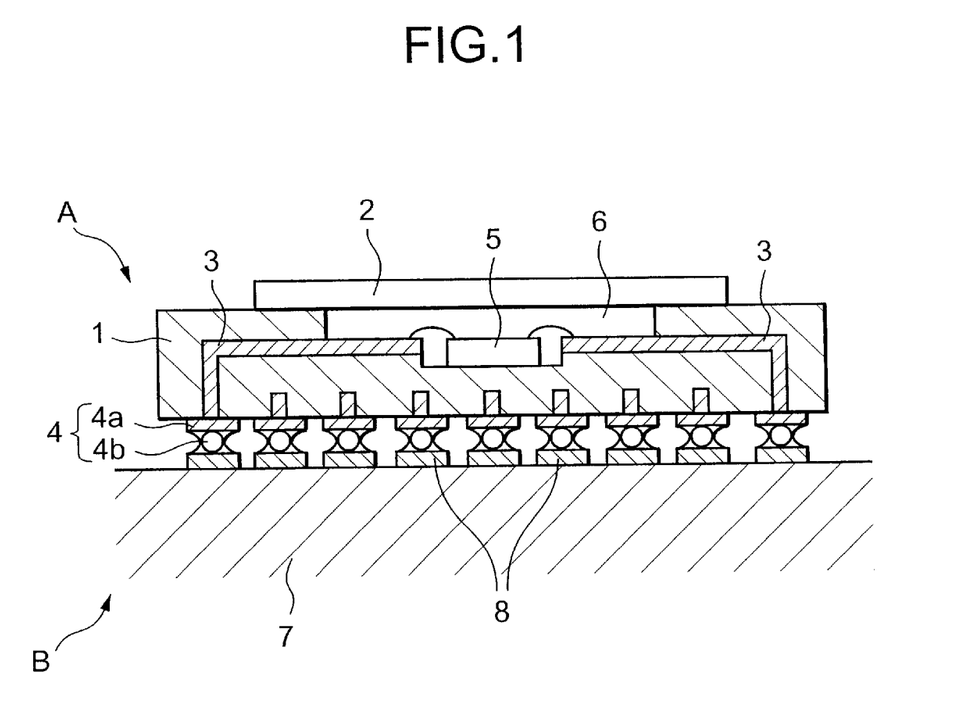
FIG. 1 is a schematic side sectional view illustrating a structure for mounting a wiring board (BGA-type semiconductor device-containing package) equipped with an insulating substrate formed of a glass ceramic sintered product of the invention.

In the mounting structure shown in FIG. 1, symbol A denotes a semiconductor device-containing package, and B denotes an external circuit board.

The semiconductor device-containing package A has a structure in which a semiconductor device 5 is mounted on a wiring board that is constituted by an insulating substrate 1, a closure 2, a metallized wiring layer 3 and connection terminals 4. That is, the insulating substrate 1 and the closure 2 are forming a cavity 6 for air-tightly sealing the semiconductor device 5 therein. In the cavity 6, the semiconductor device 5 is firmly adhered to the insulating substrate 1 with an adhesive such as glass or resin.

The metallized wiring layer 3 is arranged on the surface and inside of the insulating substrate 1 to electrically connect the semiconductor device 5 to the connection terminals 4 formed on the back surface (lower surface) of the insulating substrate 1 (the semiconductor device 5 and the metallized wiring layer 3 are electrically connected together by, for example, wires). In FIG. 1, the connection terminals 4 comprise connection pads 4a and ball terminals 4b attached to the connection pads 4a with a brazing material. The ball terminals 4b are formed of a high-melting solder (tin-lead alloy). Use of the ball terminals 4b makes it possible to maximize the number of the connection terminals (density of connection terminals) per a unit area of the package A (wiring board).

The external circuit board B is constituted by an insulator 7 and wiring conductors 8. The insulator 7 is formed of an insulating material containing an organic resin, such as a glass-epoxy composite material having a coefficient of linear thermal expansion at 40 to 400° C. of from 12 to 16 ppm/°C. In general, a printed board formed by using the above glass-epoxy composite material is used as the external circuit board B. The wiring conductors 8 are generally formed of a metal or an alloy, such as Cu, Au, Ag, Al, Ni or Pb—Sn from the standpoint of matching in the coefficient of thermal expansion with the insulator 7 and good electric conductivity.

The semiconductor device-containing package A is mounted on the external circuit board B in a manner as described below.

That is, the ball terminals 4b on the lower surface of the insulating substrate 1 of the package A are placed on, and contacted to, the wiring conductors 8 on the external circuit board B. Then, a brazing material such as low-melting solder is melted at a temperature of from about 250 to about 400° C. to join the wiring conductors 8 and the ball terminals 4b together, i.e., to accomplish the mounting. In order to easily join the wiring conductors 8 and the ball terminals 4b with the brazing material, in this case, it is desired to apply the brazing material onto the surfaces of the wiring conductors 8 in advance.

(Insulating Substrate)

According to the present invention, it is important to use a sintered product having a coefficient of linear thermal expansion at 40 to 400° C. of from 8.5 to 18 ppm/°C. and, particularly, from 8.5 to 14 ppm/°C. as an insulating substrate 1 in the wiring board such as of the package A that is mounted on the surface of the above-mentioned external circuit board B. Use of the insulating substrate 1 of a sintered product having such a coefficient of linear thermal expansion helps relax the thermal stress caused by a difference in the thermal expansion between the insulating substrate 1 and the external circuit board B and maintain favorable electrically connected condition between the external circuit board B and the package A for extended periods of time. For example, when the coefficient of thermal expansion lies outside the above-mentioned range, an increased thermal stress is caused by the difference in the thermal expansion, and the electrically connected condition is deteriorated between the external circuit board B and the package A due to heat generated by the operation of the semiconductor device 5.

The present invention uses the following glass ceramic sintered product as the one having the above-mentioned coefficient of linear thermal expansion.

(Glass Ceramic Sintered Product)

The glass ceramic sintered product constituting the insulating substrate 1 comprises (A) a glass phase containing BaO and (B) a filler phase containing metal oxide particles having a coefficient of linear thermal expansion at 40 to 400° C. of not smaller than 6 ppm/°C. (hereinafter often referred to as high-thermal-expansion metal oxide particles), and further contains (C) a Zr element at a predetermined ratio. The sintered product is obtained by firing a mixture of the BaO-containing glass powder and the filler containing the above metal oxide particles. In this case, the Zr element is usually used as a filler in the form of a compound such as an oxide or the like together with the high-thermal-expansion metal oxide particles, but may be contained in the BaO-containing glass powder.

As the BaO-containing glass powder, there is used a glass containing BaO in an amount of from 5 to 60% by weight, preferably, from 15 to 60% by weight and, most preferably, from 20 to 40% by weight. The BaO-containing glass has a low softening point and a relatively high coefficient of thermal expansion. It is therefor allowed to decrease the amount of use of the glass powder and, instead, to increase the amount of use of the filler that has a high coefficient of thermal expansion, making it possible to easily obtain a sintered product having a high coefficient of thermal expansion. It is further important that the content of BaO in the glass lies within the above-mentioned range. When the content of BaO is smaller than the above range, the glass exhibits a high softening point and a decreased coefficient of thermal expansion, making it difficult to obtain a sintered product having a high coefficient of thermal expansion. Further, use of the glass containing BaO in amounts in excess of the above range makes it difficult to accomplish the vitrification by firing. Therefore, the sintered product loses stability in its properties and exhibits markedly decreased resistance against the chemicals.

It is further desired that the above glass does not substantially contain Pb. Pb is toxic and requires a special device or management for preventing poisoning in the step of production, making it difficult to cheaply produce the sintered product. By taking the infiltration of Pb as unavoidable impurity in the glass into consideration, it is desired that the content of Pb in the glass is not larger than 0.05% by weight.

It is further desired that the glass that is used has a coefficient of linear thermal expansion at 40 to 400° C. of from 6 to 18 ppm/°C. and, particularly, from 7 to 13 ppm/°C. When the glass that is used has a coefficient of thermal expansion that lies outside the above range, a difference in the thermal expansion occurs relative to the filler (particularly, high-thermal-expansion metal oxide particles) that will be described later, causing the sintered product to lose the strength.

It is further desired that the BaO-containing glass has an yield point of from 400 to 800° C. and, particularly, from 400 to 700° C. In producing the sintered product, a binder such as organic resin is added to a mixture of the glass and the filler to mold it, and the molded product is sintered. Here, use of the glass having the yield point lying within the above range makes it possible to efficiently remove the binder that is used for molding and to effectively conduct the co-firing with the metallization. It is thus allowed to advantageously produce the wiring board having an insulating substrate 1 formed of the sintered product. For example, when there is used a glass having the yield point lower than 400° C., the sintering of the glass starts with a low temperature. This makes it difficult to effect the co-firing with the metallization such as of Ag or Cu of which the sintering start temperature is from 600 to 800° C. Besides, since the molded article becomes dense at a low temperature, the binder decomposes and vaporizes little; i.e., the binder component remains in the obtained sintered product (insulating substrate 1) to deteriorate the properties of the wiring board. When a glass having the yield point of not lower than 800° C. is used, on the other hand, the glass must be used in an increased amount to effectively conduct the sintering. That is, the expensive glass must be used in large amounts driving up the cost of the sintered product, which is not desirable.

It is desired that the glass satisfying the above-mentioned properties contains $SiO_2$ in an amount of from 25 to 60% by weight and $Al_2O_3$ in an amount of from 1 to 10% by weight in addition to the above BaO component. When the amounts of $SiO_2$ and $Al_2O_3$ are larger than these ranges, it becomes difficult to lower the softening point of the glass. Besides, the glass exhibits a low coefficient of thermal expansion making it difficult to obtain a high-thermal-expansion glass ceramic sintered product. When the amounts of $SiO_2$ and $Al_2O_3$ are smaller than these ranges, it becomes difficult to accomplish the vitrification, whereby the obtained sintered product loses stability in its properties and exhibits decreased resistance against the chemicals. Usually, furthermore, the glass contains, as other components, at least one component selected from the group consisting of $B_2O_3$, CaO, MgO, SrO, $TiO_2$ ad ZnO. So far as the coefficient of linear thermal expansion and yield point lie within the above-mentioned ranges, however, the glass may contain the Zr element component (e.g., $ZrO_2$) that will be described later.

As a filler used in combination with the glass, there are used metal oxide particles (B) having a coefficient of linear thermal expansion (hereinafter simply referred to as coefficient of thermal expansion) at 40 to 400° C. of not smaller than 6 ppm/°C. in order to render the sintered product to be highly thermally expanding. That is, without using the metal oxide particles having a coefficient of thermal expansion of not smaller than 6 ppm/°C., the coefficient of thermal expansion of the sintered product cannot be increased to be not smaller than 8.5 ppm/°C.

As the metal oxide particles having a coefficient of thermal expansion of not smaller than 6 ppm/°C., there can be used at least one selected from the group consisting of quarts ($SiO_2$), tridymite ($SiO_2$), forsterite ($2MgO.SiO_2$), spinel ($MgO.Al_2O_3$), wollastonite ($CaO.SiO_2$), montecellite ($CaO.MgO.SiO_2$), nepheline ($Na_2O.Al_2O_3.SiO_2$), diopside ($CaO.MgO.2SiO_2$), merwinite ($3CaO.MgO.2SiO_2$), akermanite ($2CaO.MgO.2SiO_2$), magnesia (MgO), alumina ($Al_2O_3$), carnegieite ($Na_2O.Al_2O_3.2SiO_2$), enstatite ($MgO.SiO_2$), magnesium borate ($2MgO.B_2O_3$), celsian ($BaO-Al_2O_3.2SiO_2$), $B_2O_3.2MgO.2SiO_2$, and gahnite ($ZnO.Al_2O_3$). The cristobalite ($SiO_2$) is a metal oxide having a coefficient of thermal expansion lying within the above-mentioned range but is not suited for the present invention. This is because the sintered product obtained by using the cristobalite exhibits a point of inflection on a curve of the coefficient of linear thermal expansion at 40 to 400° C. and easily develops. microcracks in the insulating substrate 1 as described already. In the present invention, at least one component selected from the group consisting of quartz, tridymite, forsterite and enstatite is most desirably used as the above-mentioned metal oxide particles in order to impart high thermal expansion property.

In the present invention, it is desired that the above-mentioned metal oxide particles (B) are used in the form of a mixture powder of a course powder having an average particle diameter D1 of from 3 to 6 μm and a fine powder having an average particle diameter D2 of from 0.5 to 2 μm. It is further desired that the mixture powder has a ratio D1/D2 of the average particle diameter D1 of the coarse powder to the average particle diameter D2 of the fine powder of from 2 to 6. Upon using the metal oxide particles (B) in the form of a mixture powder having such a particle size distribution, it is allowed to obtain a sintered product which is dense enough up to the interior thereof.

For example, when the ratio D1/D2 is smaller than 2, the surface of the sintered product is covered with a glass during the firing that will be described later before the binder for molding is removed, since the glass (A) having a low softening point has been used. It therefore becomes difficult to obtain a sintered product that is dense up to the interior thereof. When the ratio D1/D2 is larger than 6, on the other hand, the slurry for molding may lose properties being affected by fine components and the yield of the sheet for molding (green sheet) may decrease. When three or more kinds of powders having different average particle diameters are to be used, the ratio D1/D2 is so calculated that the powder on the most coarse side has an average particle diameter D1 and the powder on the finest side has an average particle diameter D2.

The coarse powder having an average diameter D1 of smaller than 3 μm makes it difficult to obtain a dense sintered product and the coarse powder having an average diameter of larger than 6 μm makes it difficult to obtain a dense sintered product. When the average particle diameter D2 of the fine power is smaller than 0.5 μm, the slurry for molding loses properties causing the yield of the sheet for molding (green sheet) to decrease. When the average particle diameter D2 of the fine powder is larger than 2 μm, on the other hand, it becomes difficult to obtain a dense sintered product.

It is further desired that the mixture powder of the above-mentioned metal oxide particles (B) has a mixing ratio of the coarse powder having the average particle diameter D1 to the fine powder having the average particle diameter D2 of from 95:5 to 50:50 (coarse power:fine powder). When the amount of the fine powder is smaller than the above range, it becomes difficult to obtain a dense sintered product. Or, even if a dense sintered product is obtained, the width of the firing-possible temperature range becomes very narrow (about 10° C.) causing the product to lose dimensional stability or making it difficult to effect the co-firing together with the metallized wiring layer. When the amount of the fine powder exceeds the above range, on the other hand, the slurry for molding loses properties due to large amounts of fine powdery components, and the yield of the sheet for molding (green sheet) decreases.

In the present invention, it is very important to use the Zr compound (C) as a source of supplying Zr element together with the above metal oxide particles (B). The Zr compound is usually used as a filler but may be contained in the above-mentioned Bao-containing glass (A). In the sintered product, the Zr compound is at least partly or wholly melted in the BaO-containing glass (partly precipitated in the filler phase due to firing) to markedly improve the resistance of the glass against the oxidation. As a result, the sintered product of the present invention exhibits excellent resistance against the chemicals, does not change appearance after the treatment with an acidic solution or an alkaline solution and does not permit the metallized layer to lose the strength. Further, use of the Zr compound effectively suppresses the precipitation of cristobalite that stems from the $SiO_2$ component in the BaO-containing glass (A). The obtained sintered product has no point of inflection on the curve of coefficients of linear thermal expansion at from 40 to 400° C., exhibits a coefficient of linear thermal expansion close to that of the low-resistance conductor such as Cu forming the metallized wiring layer 3 or close to that of the external circuit board B, relaxing the thermal stress that stems from a difference in the thermal expansion, and effectively preventing the occurrence of cracks caused by the thermal stress.

In the present invention, the Zr compound is at least one selected from the group consisting of $ZrO_2$, $ZrSiO_4$, $CaO.ZrO_2$, $ZrB_2$, $ZrP_2O_7$ and ZrB. When the Zr compound is used as a component of filler in the form of a powder being mixed with the metal oxide particles (B), it is desired that its BET specific surface area is not smaller than 25 $m^2/g$. When the BET specific surface area is smaller than 25 $m^2/g$, the resistance against the chemicals is little improved.

The Zr element stemming from the Zr compound should exist in the sintered product in an amount of from 0.1 to 30% by weight and, particularly, from 0.2 to 10% by weight calculated as $ZrO_2$. When its amount is smaller than 0.1% by weight, the resistance against the chemicals is little improved and the precipitation of the cristobalite is little suppressed. When its amount is larger than 30% by weight, on the other hand, the coefficient of thermal expansion becomes smaller than 8.5 ppm/°C.

In the present invention, further, there can be used, as a filler, at least one component selected from the group consisting of chromium oxide, cobalt oxide, manganese oxide and nickel oxide as a coloring component together with the metal oxide particles (B) and the Zr compound (C).

According to the present invention, the glass powder and the filler powder (at least including the above-mentioned metal oxide particles) are mixed together at a suitable ratio depending upon the objects such as firing temperature and thermally expanding property of the sintered product that is finally obtained, and the mixture is molded into a predetermined shape and is then fired. When no filler is added, the above-mentioned BaO-containing glass (A) starts contracting at a temperature of lower than 700° C., and melts at a temperature of not lower than 850° C. making it difficult to arrange the metallized wiring layer. Upon mixing the filler, however, the crystals are precipitated in the step of firing, and a liquid phase is formed at a suitable temperature for sintering the filler component in liquid phase. Besides, the contraction start temperature of the whole molded article can be raised. By adjusting the content of the filler, therefore, suitable co-firing conditions can be selected depending on the kind of the metallized wiring layer 3 that is formed on the surface or inside of the insulating substrate 1.

In the present invention, it is desired to use the powder of the glass (A) in an amount of from 20 to 80% by volume and the filler powder containing at least the metal oxide particles (B) in an amount of from 80 to 20% by volume under the condition in which the amount of the Zr compound (C) (amount of the Zr element) satisfies the above-mentioned condition. When the amount of the glass component is smaller than 20% by volume (when the filler component is larger than 80% by volume), it becomes difficult to effect the sintering in liquid phase whereby the firing temperature becomes high and the metallized wiring layer may melt during the co-firing. When the amount of the glass is larger than 80% by volume (when the filler component is smaller than 20% by volume), on the other hand, properties of the sintered product vary much depending upon the properties of the glass making it difficult to control the properties of the materials. Besides, the sintering start temperature is lowered making it difficult to effect the co-firing with the metallized wiring layer. Further, an increased amount of the glass drives up the cost of the starting material. It is further desired to suitably adjust the amount of the filler component depending on the yield point of the BaO-containing glass (A) that is used. That is, when the yield point of the glass (A) is as low as from 400 to 700° C., the sintering property is enhanced at low temperatures and, hence, it is desired to use the filler in an amount as relatively large as from 40 to 80% by volume. When the yield point of the glass (A) is as high as from 700 to 80° C., on the other hand, the sintering property decreases and, hence, it is desired to use the filler in an amount as relatively small as from 20 to 50% by volume.

The mixture of the glass powder and the filler powder prepared as described above is blended with a suitable organic resin binder to prepare a slurry for molding, and is, then, molded by known molding means such as doctor blade method, rolling method or metal mold press method. A sheet-like molded article (green sheet) obtained by the molding is fired to obtain a glass ceramic sintered product as contemplated by the invention.

To prepare a wiring board having the glass ceramic sintered product as an insulating substrate 1, a metal paste obtained by adding an organic binder, a plasticizer and a solvent to a metal powder of one or more of Cu, Ag, Ni, Pd and Au is printed in a predetermined pattern onto the green sheet by the known screen-printing method. Depending upon the case, further, the green sheet is suitably perforated to form through-holes which are also filled with the metallizing paste. A plurality of pieces of the green sheets are laminated and adhered and are, then, fired.

In effecting the firing, the binder component blended for molding is, first, removed. The binder is removed in an open atmosphere of a temperature of about 700° C. When copper is used as the wiring conductor layer 3, the binder is removed in a nitrogen atmosphere containing water vapor heated at 100 to 700° C. To effectively remove the binder in this case, it is desired that the contraction start temperature of the green sheet has been adjusted to be from about 700 to about 850° C. For this purpose, it is desired to use the BaO-containing glass (A) having an yield point lying within the above-mentioned range.

The firing is conducted in an oxidizing atmosphere of from 850 to 1100° C. to obtain a densely sintered product having a relative density of not lower than 90%. When the firing temperature is lower than 850° C., the sintered product does not become dense. When the firing temperature exceeds 1100° C., it becomes difficult to conduct the co-firing with the metallized wiring layer. When copper is used as the wiring conductor, however, it is desired that the firing is conducted in a nonoxidizing atmosphere heated at from 850 to 1050° C.

A BaO-containing glass phase and a filler phase are existing in the thus prepared glass ceramic sintered product. There may further exist a crystal phase formed by the reaction of the glass with the filler and a crystal phase formed by the decomposition of the filler component. In any way, it is desired to precipitate the crystal phase of the oxide having a coefficient of thermal expansion at 40 to 400° C. of not smaller than 6 ppm/°C., i.e., to precipitate the crystal phase of the metal oxide particles (B). Further, the Zr element (C) exists as a Zr compound phase in the sintered product, and at least part or whole thereof is melted in the BaO-containing glass phase.

When the metal oxide particles (B) are used in the form of a mixture powder of the coarse powder having an average particle diameter D1 and the fine powder having an average particle diameter D2, the particle size distribution based on the long diameters of the metal oxide particles has at least two peaks in a range of from 0.5 to 6 $\mu$m in cross section of the sintered product, and the ratio of the peak position (D1 $\mu$m) on the most coarse side to the peak position (D2 $\mu$m) on the finest side is in a range of from 2 to 6, and the sintered product becomes dense enough up to the interior thereof.

As described above, the glass ceramic sintered product of the invention comprises the BaO-containing glass, the filler of metal oxide particles having a high thermal expansion and the Zr compound, exhibits no point of inflection on the curve of coefficients of thermal expansion thereof, exhibits a coefficient of linear thermal expansion of as high as from 8.5 to 18 ppm/°C. at 40 to 400° C., and exhibits excellent resistance against the chemicals. When the sintered product is used as the insulating substrate of the wiring board such as package, therefore, the insulating substrate exhibits thermally expanding property that is close to that of the external circuit board such as printed board of an insulating material containing an organic resin. When the wiring board is mounted on the external circuit board via the connection terminals, therefore, the electrically connected state is maintained stably and reliably for extended periods of time.

EXAMPLES

Glass powders ① to ⑦ shown in Table 1 were prepared as BaO-containing glasses. Coefficients of thermal expansion in Table are those at 40 to 400° C.

TABLE 1

| Glass composition (wt. ratio) | | Yield point (° C.) | Coefficient of therm. expansion (ppm/° C.) | Pb amount (ppm) |
|---|---|---|---|---|
| ① | 43% SiO$_2$—37% BaO—9% B$_2$O$_3$—6% Al$_2$O$_3$—5% CaO | 700 | 7.0 | <50 |
| ② | 32% SiO$_2$—35% BaO—10% B$_2$O$_3$—6% Al$_2$O$_3$—5% TiO—12% SrO | 680 | 7.3 | <50 |
| ③ | 32% SiO$_2$—37% BaO—10% B$_2$O$_3$—8% CaO—6% Al$_2$O$_3$—5% MgO—3% ZrO$_2$ | 685 | 7.1 | <50 |
| ④ | 51% SiO$_2$—3% BaO—10% B$_2$O$_3$—13% CaO—22% Al$_2$O$_3$—2% MgO | 810 | 4.5 | <50 |
| ⑤ | 29% SiO$_2$—55% BaO—7% B$_2$O$_3$—2% Al$_2$O$_3$—7% ZnO | 657 | 10.8 | <50 |
| ⑥ | 30% SiO$_2$—55% BaO—7% B$_2$O$_3$—1% Al$_2$O$_3$—7% ZnO | 549 | 11.0 | <50 |
| ⑦ | 26% SiO$_2$—55% BaO—7% B$_2$O$_3$—2% Al$_2$O$_3$—7% ZnO—3% ZrO$_2$ | 660 | 9.1 | <50 |

Experiment 1

A mixture of a quartz powder having an average particle diameter of 5 $\mu$m and a quartz powder having an average particle diameter of 1 $\mu$m at a weight ratio of 8:2 (SiO$_2$, coefficient of thermal expansion of 15 ppm/°C.), a ZrO$_2$ powder having a BET specific surface area of 180 cm$^2$/g and Cr$_2$O$_3$ were weighed and mixed as shown in Tables 2 to 4 to the glasses ① to ④ o obtain compositions as shown in Tables 2 to 4. After the mixtures were pulverized, an organic binder and an organic solvent were added and mixed thereto to a sufficient degree, and the mixtures were formed into tapes by the doctor blade method and were laminated and molded into a predetermined shape. The molded articles were subjected to the treatment for removing the binder therefrom in N$_2$+H$_2$O at 700° C. and were fired in a nitrogen atmosphere at temperatures shown in Tables 2 to 4 to prepare glass ceramic sintered products.

Further, samples were prepared having a metallized pattern of tungsten in a square of 2 mm formed on the surface of the tape after the firing, and were fired under the same conditions as those described above, followed by plating with Ni—Au.

The thus obtained sintered products were measured for their coefficients of thermal expansion at 40 to 400° C. as shown in Tables 2 to 4. Further, the sintered products each having a surface area of 5 cm$^2$ were cut out and were immersed in a hydrofluoric acid of a normal temperature obtained by dissolving 10 g of NH$_4$F.HF in a liter of water for 90 seconds to measure a reduction in the weight (mg). At the same time, the surface state was observed through the SEM (scanning-type electron microscope), color tone was evaluated by naked eyes, and a change in the color tone after the treatment with hydrofluoric acid was evaluated. In the observation through the SEM, those from which the glass components are missing to a conspicuous degree are evaluated to be NG, and those exhibiting the surface state that is not almost changing before and after the treatment are evaluated to be OK.

Further, the metallized patterns formed on the surfaces of the sintered products were measured for their adhesion strength. Nickel was plated maintaining a thickness of 1 mm on the metallized pattern having a square shape of 2 mm and a thickness of 15 μm after the firing, gold was plated thereon maintaining a thickness of 1 mm, a tin-plated copper wire having a diameter of 0.8 mm were soldered onto the plated layer in parallel with the substrate, the tin-plated copper wire was bent in a vertical direction relative to the substrate, the tin-plated copper wiring was pulled in the vertical direction at a pulling speed of 10 mm/min, and the load of when the tin-plated copper wire was removed was evaluated as the adhesion strength of the metallization.

Then, by using the glass ceramic sintered product as an insulating substrate, the metallized wiring layer was formed by co-firing the copper metallized layer in order to prepare a BGA-type semiconductor device-containing package as shown in FIG. 1. The package was then mounted by soldering on the wiring conductor of copper formed on the surface of an external circuit board using the glass-epoxy composite material as an insulating substrate. Then, the mounted package was subjected to the heat cycle testing at −40 to 125° C., and the resistance was measured between the metallized wiring layer of the package and the wiring conductor of the external circuit board after every 100 cycles. The numbers of heat cycles of when a change has occurred in the resistance were as shown in Tables 2 to 4.

TABLE 2

| Sample No. | Composition (% by wt.) | | | | Firing temp. (° C.) | Co-efficient of therm. expansion (ppm/° C.) | Reduction of weight after treated with HF (mg) | Strength of metal-lization (Kgf) | Surface condition SEM | Color tone | Change in color tone | Heat cycle testing (times) |
|---|---|---|---|---|---|---|---|---|---|---|---|---|
| | Glass | Quartz | Cr₂O₃ | ZrO₂ | | | | | | | | |
| *1 | ①45 | 55 | — | 0 | 980 | 13.0 | 18 | 1.4 | NG | white | yes | 2000 or more |
| *2 | ①50 | 50 | — | 0 | 940 | 12.5 | 20 | 1.3 | NG | white | yes | 2000 or more |
| *3 | ①55 | 45 | — | 0 | 900 | 12.1 | 23 | 1.3 | NG | white | yes | 2000 or more |
| *4 | ①50 | 49.9 | 0.1 | 0 | 940 | 12.5 | 15 | 1.5 | NG | green | yes | 2000 or more |
| *5 | ①50 | 49.7 | 0.3 | 0 | 940 | 12.4 | 12 | 1.6 | NG | green | yes | 2000 or more |
| *6 | ①50 | 49 | 1 | 0 | 940 | 12.3 | 10 | 1.6 | NG | green | yes | 2000 or more |
| 7 | ①50 | 49.9 | — | 0.1 | 940 | 12.5 | 4 | 2.0 | OK | white | no | 2000 or more |
| 8 | ①50 | 49.7 | — | 0.3 | 940 | 12.5 | 1 | 2.3 | OK | white | no | 2000 or more |
| 9 | ①50 | 49.5 | — | 0.5 | 940 | 12.5 | 0 | 2.4 | OK | white | no | 2000 or more |
| 10 | ①50 | 49 | — | 1 | 940 | 12.5 | 0 | 2.5 | OK | white | no | 2000 or more |
| 11 | ①50 | 48 | — | 2 | 940 | 12.5 | 0 | 2.4 | OK | white | no | 2000 or more |
| 12 | ①50 | 47 | — | 3 | 940 | 12.5 | 0 | 2.6 | OK | white | no | 2000 or more |
| 13 | ①50 | 40 | — | 10 | 940 | 11.7 | 0 | 2.5 | OK | white | no | 2000 or more |
| 14 | ①50 | 30 | — | 20 | 940 | 10.9 | 0 | 2.5 | OK | white | no | 2000 or more |
| 15 | ①50 | 25 | — | 25 | 940 | 10.0 | 0 | 2.6 | OK | white | no | 2000 or more |
| 16 | ①50 | 20 | — | 30 | 940 | 9.1 | 0 | 2.5 | OK | white | no | 2000 or more |
| *17 | ①50 | 15 | — | 35 | 940 | 8.2 | 0 | 2.7 | OK | white | no | 1500 |
| 18 | ①50 | 49.6 | 0.3 | 0.1 | 940 | 12.5 | 3 | 2.2 | OK | green | no | 2000 or more |
| 19 | ①50 | 49.4 | 0.3 | 0.3 | 940 | 12.5 | 0 | 2.4 | OK | green | no | 2000 or more |
| 20 | ①50 | 49.2 | 0.3 | 0.5 | 940 | 12.5 | 0 | 2.4 | OK | green | no | 2000 or more |
| 21 | ①50 | 48.7 | 0.3 | 1 | 940 | 12.5 | 0 | 2.5 | OK | green | no | 2000 or more |
| 22 | ①50 | 47.7 | 0.3 | 2 | 940 | 12.5 | 0 | 2.5 | OK | green | no | 2000 or more |
| 23 | ①50 | 46.7 | 0.3 | 3 | 940 | 12.5 | 0 | 2.6 | OK | green | no | 2000 or more |
| 24 | ①50 | 39.7 | 0.3 | 10 | 940 | 11.6 | 0 | 2.5 | OK | green | no | 2000 or more |
| 25 | ①50 | 29.7 | 0.3 | 20 | 940 | 10.7 | 0 | 2.6 | OK | green | no | 2000 or more |
| 26 | ①50 | 24.7 | 0.3 | 25 | 940 | 9.9 | 0 | 2.5 | OK | green | no | 2000 or more |
| 27 | ①50 | 19.7 | 0.3 | 30 | 940 | 9.0 | 0 | 2.5 | OK | green | no | 2000 or more |
| *28 | ①50 | 14.7 | 0.3 | 35 | 940 | 8.4 | 0 | 2.6 | OK | green | no | 1600 |

Sample marked with * lie outside the scope of the invention.

TABLE 3

| Sample No. | Composition (% by wt.) | | | | Firing temp. (° C.) | Co-efficient of therm. expansion (ppm/° C.) | Reduction of weight after treated with HF (mg) | Strength of metal-lization (Kgf) | Surface condition SEM | Color tone | Change in color tone | Heat cycle testing (times) |
|---|---|---|---|---|---|---|---|---|---|---|---|---|
| | Glass | Quartz | Cr₂O₃ | ZrO₂ | | | | | | | | |
| *29 | ②45 | 55 | — | 0 | 960 | 13.2 | 16 | 1.5 | NG | white | yes | 2000 or more |
| *30 | ②50 | 50 | — | 0 | 920 | 12.6 | 18 | 1.3 | NG | white | yes | 2000 or more |
| *31 | ②55 | 45 | — | 0 | 880 | 12.2 | 20 | 1.3 | NG | white | yes | 2000 or inore |

TABLE 3-continued

| Sample No. | Composition (% by wt.) | | | | Firing temp. (° C.) | Co-efficient of therm. expansion (ppm/° C.) | Reduction of weight after treated with HF (mg) | Strength of metallization (Kgf) | Surface condition SEM | Color tone | Change in color tone | Heat cycle testing (times) |
|---|---|---|---|---|---|---|---|---|---|---|---|---|
| | Glass | Quartz | $Cr_2O_3$ | $ZrO_2$ | | | | | | | | |
| *32 | ②50 | 49.9 | 0.1 | 0 | 920 | 12.6 | 14 | 1.6 | NG | green | yes | 2000 or more |
| *33 | ②50 | 49.7 | 0.3 | 0 | 920 | 12.5 | 11 | 1.7 | NG | green | yes | 2000 or more |
| *34 | ②50 | 49 | 1 | 0 | 920 | 12.4 | 9 | 1.6 | NG | green | yes | 2000 or more |
| 35 | ②50 | 49.9 | — | 0.1 | 920 | 12.6 | 3 | 2.0 | OK | white | no | 2000 or more |
| 36 | ②50 | 49.7 | — | 0.3 | 920 | 12.6 | 1 | 2.0 | OK | white | no | 2000 or more |
| 37 | ②50 | 49.5 | — | 0.5 | 920 | 12.6 | 0 | 2.1 | OK | white | no | 2000 or more |
| 38 | ②50 | 49 | — | 1 | 920 | 12.6 | 0 | 2.2 | OK | white | no | 2000 or more |
| 39 | ②50 | 48 | — | 2 | 920 | 12.6 | 0 | 2.2 | OK | white | no | 2000 or more |
| 40 | ②50 | 47 | — | 3 | 920 | 12.6 | 0 | 2.2 | OK | white | no | 2000 or more |
| 41 | ②50 | 40 | — | 10 | 920 | 11.8 | 0 | 2.5 | OK | white | no | 2000 or more |
| 42 | ②50 | 30 | — | 20 | 920 | 11.0 | 0 | 2.5 | OK | white | no | 2000 or more |
| 43 | ②50 | 25 | — | 25 | 920 | 10.2 | 0 | 2.6 | OK | white | no | 2000 or more |
| 44 | ②50 | 20 | — | 30 | 920 | 9.3 | 0 | 2.5 | OK | white | no | 2000 or more |
| *45 | ②50 | 15 | — | 35 | 920 | 8.4 | 0 | 2.7 | OK | white | no | 1600 |
| 46 | ②50 | 49.6 | 0.3 | 0.1 | 920 | 12.5 | 2 | 2.1 | OK | green | no | 2000 or more |
| 47 | ②50 | 49.4 | 0.3 | 0.3 | 920 | 12.5 | 0 | 2.0 | OK | green | no | 2000 or more |
| 48 | ②50 | 49.2 | 0.3 | 0.5 | 920 | 12.5 | 0 | 2.0 | OK | green | no | 2000 or more |
| 49 | ②50 | 48.7 | 0.3 | 1 | 920 | 12.5 | 0 | 2.3 | OK | green | no | 2000 or more |
| 50 | ②50 | 47.7 | 0.3 | 2 | 920 | 12.5 | 0 | 2.5 | OK | green | no | 2000 or more |
| 51 | ②50 | 46.7 | 0.3 | 3 | 920 | 12.5 | 0 | 2.6 | OK | green | no | 2000 or more |
| 52 | ②59 | 39.7 | 0.3 | 10 | 920 | 11.7 | 0 | 2.5 | OK | green | no | 2000 or more |
| 53 | ②50 | 29.7 | 0.3 | 20 | 920 | 10.8 | 0 | 2.6 | OK | green | no | 2000 or more |
| 54 | ②50 | 24.7 | 0.3 | 25 | 920 | 10.0 | 0 | 2.5 | OK | green | no | 2000 or more |
| 55 | ②50 | 19.7 | 0.3 | 30 | 920 | 9.1 | 0 | 2.5 | OK | green | no | 2000 or more |
| *56 | ②50 | 14.7 | 0.3 | 35 | 920 | 8.4 | 0 | 2.6 | OK | green | no | 1600 |

Sample marked with * lie outside the scope of the invention.

TABLE 4

| Sample No. | Composition (% by wt.) | | | | Firing temp. (° C.) | Co-efficient of therm. expansion (ppm/° C.) | Reduction of weight after treated with HF (mg) | Strength of metallization (Kgf) | Surface condition SEM | Color tone | Change in color tone | Heat cycle testing (times) |
|---|---|---|---|---|---|---|---|---|---|---|---|---|
| | Glass | Quartz | $Cr_2O_3$ | $ZrO_2$ | | | | | | | | |
| 57 | ③45 | 55 | — | 0 | 960 | 13.2 | 0 | 2.2 | OK | white | no | 2000 or more |
| 58 | ③50 | 50 | — | 0 | 920 | 12.6 | 0 | 2.3 | OK | white | no | 2000 or more |
| 59 | ③55 | 45 | — | 0 | 880 | 12.2 | 0 | 2.3 | OK | white | no | 2000 or inore |
| 60 | ③50 | 49.9 | 0.1 | 0 | 920 | 12.6 | 0 | 2.3 | OK | green | no | 2000 or more |
| 61 | ③50 | 49.7 | 0.3 | 0 | 920 | 12.5 | 0 | 2.4 | OK | green | no | 2000 or more |
| 62 | ③50 | 49 | 1 | 0 | 920 | 12.4 | 0 | 2.3 | OK | green | no | 2000 or more |
| *63 | ③50 | 29 | — | 1 | 920 | 7.0 | 0 | 2.2 | OK | green | no | 300 |
| *64 | ③50 | 28 | — | 2 | 920 | 6.7 | 0 | 2.4 | OK | green | no | 200 |
| *65 | ③50 | 25 | — | 5 | 920 | 6.5 | 0 | 2.4 | OK | green | no | 200 |

Sample marked with * lie outside the scope of the invention.

As will be obvious from Tables 2 to 4, in the samples Nos. 1 to 6 and 29 to 34 containing the Zr compound in amounts of smaller than 0.1% by weight, a large reduction in the weight is recognized after the treatment with the hydrofluoric acid, and the surface conditions are greatly changing even by the observation through the SEM. Besides, observation by eyes of the sintered products exhibiting a green color indicates an apparent change in the color tone. Further, the strength of metallization becomes lower than 2 kg/2 mm² as the glass component mechanically bonding the metallized layer with the ceramic is lost.

On the other hand, the samples of the present invention containing the Zr compound in an amount of from 0.1 to 30% by weight exhibits almost no change in the weight after the treatment with hydrofluoric acid as compared with the samples Nos. 1 to 6 and 29 to 34 to which no Zr compound is added, and further exhibit no change before or after the treatment even in the observation by the SEM or in the observation by eyes. Besides, the strength of metallization is not lower than 1.8 kgf/2 mm², which is sufficiently practicable.

Upon changing the amount of addition of $ZrO_2$ within a range of from 0.1 to 30% by weight, further, the coefficient of thermal expansion of the sintered product can be adjusted. In the samples Nos. 17, 28, 45 and 56 containing the Zr compound in amounts larger than 30% by weight, however, the coefficients of thermal expansion of the sintered products are smaller than 8.5 ppm/° C. and are inferior to the products of the present invention even in the heat cycle testing.

The samples Nos. 57 to 62 using the glass ③ containing $ZrO_2$ instead of using the filler of $ZrO_2$, too, exhibit the resistance against the chemicals. These results tell that $ZrO_2$ is effective in improving the resistance against the chemicals even when it is contained in the filler or in the glass in advance.

Further, the samples Nos. 63 to 65 using the glass ④ containing not smaller than 5% by weight of BaO exhibit coefficients of thermal expansion of not higher than 8.5 ppm/° C. and fail to exhibit satisfactory properties in the heat cycle testing.

Experiment 2

A plurality of kinds of $ZrO_2$ powders having different BET specific surface areas were mixed at ratios shown in Table 5 in the same manner as in Example 1, and were molded and fired to obtain glass ceramic sintered products which were then evaluated by the same method as that of Experiment 1. The results were as shown in Table 5.

into a predetermined shape. The molded articles were subjected to the treatment for removing the binder therefrom in $N_2+H_2O$ at 700° C. and were fired in a nitrogen atmosphere at temperatures shown in Tables 6 to 8 to prepare glass ceramic sintered products.

The thus obtained sintered products were identified for their crystal phases relying on the X-ray diffraction by using a Cu target.

Next, the thus obtained sintered products were measured for their coefficients of thermal expansion at 40 to 400° C. as shown in Tables 6 to 8. As for the presence of points of inflection on a curve of coefficients of linear thermal expansion in the above-mentioned temperature region caused by the precipitation of the cristobalite crystals, those exhibiting the coefficients of thermal expansion at 150 to 250° C. which are larger than the coefficients of thermal expansion at 250 to 350° C. were judged to have points of inflection, and those

TABLE 5

| Sample | Composition (% by wt.) | | | | BET of $ZrO_2$ | Firing temp. | Coefficient of therm. expansion | Reduction of weight after treated with HF | Strength of metallization | Surface condition | Color | Change in color | Heat cycle testing |
|---|---|---|---|---|---|---|---|---|---|---|---|---|---|
| No. | Glass | Quartz | $Cr_2O_3$ | $ZrO_2$ | $(m^2/g)$ | (° C.) | (ppm/° C.) | (mg) | (Kgf) | SEM | tone | tone | (times) |
| 66 | ①50 | 49.4 | 0.3 | 0.3 | 15 | 940 | 12.4 | 9 | 2.0 | OK | green | no | 2000 or more |
| 67 | ①50 | 49.4 | 0.3 | 0.3 | 26 | 940 | 12.4 | 5 | 2.4 | OK | green | no | 2000 or more |
| 68 | ①50 | 49.4 | 0.3 | 0.3 | 150 | 940 | 12.4 | 0 | 2.6 | OK | green | no | 2000 or more |
| 69 | ②50 | 49.4 | 0.3 | 0.3 | 15 | 920 | 12.5 | 7 | 2.0 | OK | green | no | 2000 or more |
| 70 | ②50 | 49.4 | 0.3 | 0.3 | 26 | 920 | 12.5 | 4 | 2.5 | OK | green | no | 2000 or more |
| 71 | ②50 | 49.4 | 0.3 | 0.3 | 150 | 920 | 12.5 | 0 | 2.6 | OK | green | no | 2000 or more |

Sample marked with * lie outside the scope of the invention.

It will be understood from the results of Table 5 that when the $ZrO_2$ and $Cr_2O_3$ powders have BET specific surface areas of larger than 25 $m^2/g$, there is almost no change in the weight after the treatment with hydrofluoric acid, and no change is recognized before or after the treatment with hydrofluoric acid even in the observation by SEM or eyes. As the BET specific surface areas decrease, however, the weight decreases through the treatment with hydrofluoric acid, color tone changes and the strength of metallization decreases. It is therefore desired that the powders have BET specific surface areas of not smaller than 25 $m^2/g$.

Experiment 3

A mixture of a quartz powder having an average particle diameter of 5 μm and a quartz powder having an average particle diameter of 1 μm at a weight ratio of 8:2 ($SiO_2$, coefficient of thermal expansion of 15 ppm/° C.) as shown in Tables 6 to 8 and a $ZrO_2$ powder having a BET specific surface area of 0.0180 $m^2/g$ were weighed and mixed to the glasses ① to ⑦ to obtain compositions as shown in Tables 6 to 8. After the mixtures were pulverized, an organic binder and an organic solvent were added and mixed thereto to a sufficient degree, and the mixtures were formed into tapes by the doctor blade method and were laminated and molded exhibiting the coefficients of thermal expansion at 150 to 250° C. which are smaller than the coefficients of thermal expansion at 250 to 350° C. were judged to have no point of inflection. The insulating substrates were checked concerning the presence of microcracks by using a flow detecting solution which is a Zyglo solution.

Then, by using the glass ceramic sintered product as an insulating substrate, the metallized wiring layer was formed by co-firing the copper metallized layer in order to prepare a BGA-type semiconductor device-containing package as shown in FIG. 1. The package was then mounted by soldering on the wiring conductor of copper formed on the surface of an external circuit board using the glass-epoxy composite material as an insulating substrate. Then, the mounted package was subjected to the heat cycle testing at −40 to 125° C., and the resistance was measured between the metallized wiring layer of the package and the wiring conductor of the external circuit board after every 100 cycles. The numbers of heat cycles of when a change has occurred in the resistance were as shown in Tables 6 to 8.

TABLE 6

| Sample No. | Composition (% by wt) Glass | Quartz | ZrO$_2$ | Firing temp. (° C.) | Detected crystal phase Note 1) | Coefficient of thermal expansion (ppm/° C.) | Point of inflection | Heat cycle testing (times) | Micro-cracks | Reduction of weight after treated with HF (mg) |
|---|---|---|---|---|---|---|---|---|---|---|
| *1 | ①55.0 | 45.0 | 0 | 940 | Q, C | 13.3 | yes | 2000 or more | yes | 24 |
| *2 | ①51.0 | 49.0 | 0 | 940 | Q, C | 13.6 | yes | 2000 or more | yes | 20 |
| *3 | ①50.0 | 50.0 | 0 | 980 | Q, C | 18.1 | yes | 200 | yes | 20 |
| *4 | ①50.0 | 50.0 | 0 | 960 | Q, C | 15.3 | yes | 1600 | yes | 19 |
| *5 | ①50.0 | 50.0 | 0 | 940 | Q, C | 13.6 | yes | 2000 or more | yes | 21 |
| *6 | ①50.0 | 49.0 | 1.0 | 980 | Q, C | 16.5 | yes | 1400 | yes | 0 |
| *7 | ①50.0 | 49.0 | 1.0 | 960 | Q, C | 13.9 | yes | 2000 or more | yes | 0 |
| 8 | ①50.0 | 49.0 | 1.0 | 940 | Q | 12.6 | no | 2000 or more | no | 0 |
| *9 | ①50.0 | 45.0 | 5.0 | 980 | Q, B, C | 13.7 | yes | 2000 or more | yes | 0 |
| 10 | ①50.0 | 45.0 | 5.0 | 960 | Q, B | 12.1 | no | 2000 or more | no | 0 |
| 11 | ①50.0 | 45.0 | 5.0 | 940 | Q, B | 12.0 | no | 2000 or more | no | 0 |
| *12 | ①50.0 | 40.0 | 10.0 | 980 | Q, B, C | 11.2 | yes | 2000 or more | yes | 0 |
| 13 | ①50.0 | 40.0 | 10.0 | 960 | Q, B | 11.6 | no | 2000 or more | no | 0 |
| 14 | ①50.0 | 40.0 | 10.0 | 940 | Q, B | 11.8 | no | 2000 or more | no | 0 |
| 15 | ①50.0 | 30.0 | 20.0 | 980 | Q, B | 10.6 | no | 2000 or more | no | 0 |
| 16 | ①50.0 | 30.0 | 20.0 | 960 | Q, B | 10.8 | no | 2000 or more | no | 0 |
| 17 | ①50.0 | 30.0 | 20.0 | 940 | Q, B | 11.0 | no | 2000 or more | no | 0 |
| 18 | ①50.0 | 20.0 | 30.0 | 980 | B, Q | 9.3 | no | 2000 or more | no | 0 |
| *19 | ①50.0 | 15.0 | 35.0 | 980 | B, Q | 8.2 | no | 1600 | no | 0 |

Samples marked with * lie outside the scope of the invention.

TABLE 7

| Sample No. | Composition (% by wt) Glass | Quartz | ZrO$_2$ | Firing temp. (° C.) | Detected crystal phase Note 1) | Coefficient of thermal expansion (ppm/° C.) | Point of inflection | Heat cycle testing (times) | Micro-cracks | Reduction of weight after treated with HF (mg) |
|---|---|---|---|---|---|---|---|---|---|---|
| *20 | ⑤53.5 | 46.5 | 0 | 960 | Q, S, C | 13.3 | yes | 2000 or more | yes | 32 |
| *21 | ⑤53.0 | 47.0 | 0 | 960 | Q, S, C | 13.8 | yes | 2000 or more | yes | 30 |
| *22 | ⑤52.5 | 47.5 | 0 | 980 | Q, S, C | 16.1 | yes | 1600 | yes | 30 |
| *23 | ⑤52.5 | 47.5 | 0 | 960 | Q, S, C | 14.1 | yes | 2000 or more | yes | 28 |
| 24 | ⑤52.5 | 47.0 | 0.5 | 980 | Q, S, C | 14.9 | yes | 2000 or more | yes | 0 |
| 25 | ⑤52.5 | 47.0 | 0.5 | 960 | Q, S, C | 13.5 | yes | 2000 or more | yes | 0 |
| 26 | ⑤52.5 | 46.5 | 1.0 | 980 | Q, S, C | 14.0 | yes | 2000 or more | yes | 0 |
| 27 | ⑤52.5 | 46.5 | 1.0 | 960 | Q, S | 13.0 | no | 2000 or more | no | 0 |
| 28 | ⑤52.5 | 46.5 | 1.0 | 940 | Q, S | 13.2 | no | 2000 or more | no | 0 |
| 29 | ⑤52.5 | 44.5 | 3.0 | 980 | Q, S | 12.1 | no | 2000 or more | no | 0 |
| 30 | ⑤52.5 | 44.5 | 3.0 | 960 | Q, S | 12.2 | no | 2000 or more | no | 0 |
| 31 | ⑤52.5 | 44.5 | 3.0 | 940 | Q, S | 12.5 | no | 2000 or more | no | 0 |
| 32 | ⑤52.5 | 38.5 | 9.0 | 980 | Q, S, B | 10.9 | no | 2000 or more | no | 0 |
| 33 | ⑤52.5 | 38.5 | 9.0 | 960 | Q, S, B | 10.9 | no | 2000 or more | no | 0 |
| 34 | ⑤52.5 | 38.5 | 9.0 | 940 | Q, S, B | 11.2 | no | 2000 or more | no | 0 |
| 35 | ⑤52.5 | 17.5 | 30.0 | 980 | B, Q, S | 9.6 | no | 2000 or more | no | 0 |
| *36 | ⑤52.5 | 7.5 | 40.0 | 980 | B, Q, S | 8.4 | no | 1600 | no | 0 |

Samples marked with * lie outside the scope of the invention.

TABLE 8

| Sample No. | Composition (% by wt) Glass | Quartz | ZrO$_2$ | Firing temp. (° C.) | Detected crystal phase Note 1) | Coefficient of thermal expansion (ppm/° C.) | Point of inflection | Heat cycle testing (times) | Micro-cracks | Reduction of weight after treated with HF (mg) |
|---|---|---|---|---|---|---|---|---|---|---|
| *37 | ⑥54.5 | 45.5 | 0 | 960 | Q, S, C | 14.9 | yes | 2000 or more | yes | 30 |
| *38 | ⑥53.0 | 46.5 | 0 | 960 | Q, S, C | 15.3 | yes | 2000 or more | yes | 27 |
| *39 | ⑥52.5 | 47.5 | 0 | 980 | Q, S, C | 20.0 | yes | 200 | yes | 26 |
| *40 | ⑥52.5 | 47.5 | 0 | 960 | Q, S, C | 16.1 | yes | 2000 or more | yes | 27 |
| 41 | ⑥52.5 | 46.5 | 1.0 | 980 | Q, S, C | 16.4 | yes | 1600 | yes | 0 |
| 42 | ⑥52.5 | 46.5 | 1.0 | 960 | Q, S | 13.6 | no | 2000 or more | no | 0 |

TABLE 8-continued

| Sample No. | Composition (% by wt) Glass | Quartz | ZrO₂ | Firing temp. (°C.) | Detected crystal phase Note 1) | Coefficient of thermal expansion (ppm/°C.) | Point of inflection | Heat cycle testing (times) | Micro-cracks | Reduction of weight after treated with HF (mg) |
|---|---|---|---|---|---|---|---|---|---|---|
| 43 | ⑥52.5 | 45.5 | 2.0 | 980 | Q, S | 13.2 | no | 2000 or more | no | 0 |
| 44 | ⑥52.5 | 45.5 | 2.0 | 960 | Q, S | 12.9 | no | 2000 or more | no | 0 |
| 45 | ⑥52.5 | 37.5 | 10.0 | 980 | Q, S, B | 10.7 | no | 2000 or more | no | 0 |
| 46 | ⑥52.5 | 37.5 | 10.0 | 960 | Q, S, B | 11.4 | no | 2000 or more | no | 0 |
| 47 | ⑥52.5 | 17.5 | 30.0 | 980 | B, Q, S | 9.9 | no | 2000 or more | no | 0 |
| *48 | ⑥52.5 | 2.5 | 45.0 | 980 | B, S | 8.1 | no | 1400 | no | 0 |
| 49 | 752.5 | 47.5 | 0 | 980 | Q, S | 12.8 | no | 2000 or more | no | 0 |
| 50 | 752.5 | 47.5 | 0 | 960 | Q, S | 12.6 | no | 2000 or more | no | 0 |
| 51 | 752.5 | 47.5 | 0 | 940 | Q, S | 12.6 | no | 2000 or more | no | 0 |
| *52 | 450.0 | 50.0 | 0 | 920 | Q | 7.5 | no | 1000 | no | 0 |
| *53 | 450.0 | 49.0 | 1.0 | 920 | Q | 7.0 | no | 300 | no | 0 |
| *54 | 450.0 | 48.0 | 2.0 | 920 | Q | 6.7 | no | 200 | no | 0 |
| *55 | 450.0 | 45.0 | 5.0 | 920 | Q, B | 6.5 | no | 200 | no | 0 |

Samples marked with * lie outside the scope of the invention.

As will be obvious from Tables 6 to 8, when Zr compound is not added, in the samples Nos. 1 to 5, 20 to 23 and 37 to 40 using the glasses ⑤, and ⑥, the cristobalite precipitates, the point of inflection exists and microcracks develop.

On the other hand, the precipitation of cristobalite is suppressed with an increase in the added amount of Zr compound. Even in the samples Nos. 24 and 25 containing not more than 1% by weight of Zr and in the samples Nos. 6, 7, 9 and 12 containing Zr in amounts of from 1 to 30% by weight but which are fired at too high temperatures, the cristobalite precipitates, the point of inflection exists and microcracks develop.

In the samples Nos. 19, 36 and 48 containing Zr in amounts in excess of 30% by weight, the coefficients of thermal expansion of the sintered products are all smaller than 8.5 ppm/°C. and are inferior to the products of the present invention in the heat cycle testing.

By changing the amount of addition of $ZrO_2$ within a range of from 1 to 30% by weight, the coefficients of thermal expansion of the sintered products can be adjusted. By effecting the firing at a low temperature, further, the formation of the cristobalite is suppressed. In this case, no point of inflection is observed and no microcrack develops.

The samples Nos. 49 to 51 using the glass ⑦ containing $ZrO_2$ instead of using the filler of $ZrO_2$, too, exhibit the effect for suppressing the point of inflection. These results tell that $ZrO_2$ is effective in suppressing the point of inflection even when it is contained in the filler or in the glass in advance.

Further, the samples Nos. 52 to 55 using the glass ④ containing not more than 5% by weight of BaO exhibit coefficients of thermal expansion of lower than 8.5 ppm/°C. and fail to exhibit satisfactory properties in the heat cycle testing.

Experiment 4

Various kinds of quartz powders having average particle diameters of from 1 to 7 μm ($SiO_2$, coefficient of thermal expansion of 15 ppm/°C.) were added at ratios shown in FIG. 9 and a $ZrO_2$ powder having a specific surface area of 180 cm²/g was added in an amount of 5% by weight to the glasses ② and ④ of Table 1 as shown in Table 9.

After the mixtures were pulverized, an organic binder and an organic solvent were added and mixed thereto to a sufficient degree, and the mixtures were formed into tapes by the doctor blade method and were laminated and molded into a predetermined shape. The molded articles were subjected to the treatment for removing the binder therefrom in $N_2+H_2O$ at 700° C. and were fired in a nitrogen atmosphere at temperatures shown in Table 9 to prepare glass ceramic sintered products.

The thus obtained sintered products were calculated for their relative densities relying on the Archimedes' method. The sintering-possible temperature ranges for the compositions are those ranges in which the relative densities do not become smaller than 90%.

Next, the thus obtained sintered products were measured for their coefficients of thermal expansion, and their surfaces after treated with hydrofluoric acid were observed using the SEM in the same manner as in Experiment 1.

Cross sections of the thus obtained sintered products were observed by using the SEM (scanning-type electron microscope), and the particle size distribution of the $SiO_2$ particles was image-analyzed to find D1, D2, and D1/D2.

(Mounting Test)

Samples for evaluating the mounting reliability test will now be described. Tapes were prepared by using mixture powders of the samples relying on the doctor blade method, and a metallized wiring layer was formed on the surfaces of the tapes by applying a Cu metallizing paste by the screen-printing method. Further, through-holes were formed in the green sheets at predetermined portions in a manner that the interiors of the through-holes were finally exposed to the lower surface of the substrate. The through-holes were filled with the Cu metallizing paste. Six pieces of green sheets coated with the metallized paste were laminated while positioning the through-holes and were adhered together with the application of pressure.

After the binder was removed from the laminates in $N_2+H_2O$ at 700° C., the metallized wiring layers and the insulating substrates were co-fired at each of the firing temperatures to prepare wiring boards for packages. Next, dents were formed in the lower surfaces of the wiring boards at places connecting to the through-holes to form Cu-metallized connection pads. Connection terminals of a solder (30 to 10% of tin and 70 to 90% of lead) were attached to the connection pads as shown in FIG. 1. The connection terminals were formed on the whole lower surfaces of the wiring boards at a density of 30 terminals per 1 cm².

Further, printed boards were prepared having a wiring conductor of copper foil formed on the surface of an insulator of a glass-epoxy substrate having a coefficient of linear thermal expansion at 40 to 800° C. of 13 ppm/°C. The wiring boards for packages and the printed boards were so positioned that the wiring conductors of the printed boards were connected to the connection terminals of the insulating boards for packages, followed by the heat treatment in an $N_2$ atmosphere at 260° C. for 3 minutes to mount the wiring boards for packages on the surfaces of the printed boards. It was confirmed that due to the heat treatment, the connection terminals of the solder of the wiring boards for packages melted and were electrically connected to the wiring conductors of the printed boards. Next, the testing samples each comprising the wiring board for package mounted on the surface of the printed board, were introduced into constant-temperature vessels maintained at temperatures of −40° C. and 125° C. and were held for 15 minutes, respectively, forming a cycle. This cycle was repeated a maximum of 1000 times. The electric resistances of the wiring conductors of the printed boards and of the wiring boards for packages were measured every after 100 cycles, and the number of cycles were counted until the electric resistance has changed. The results were as shown in Table 10.

TABLE 9

| | | | Filler** | | | | | |
|---|---|---|---|---|---|---|---|---|
| | | | Coarse powder | | Fine powder | | | |
| | Glass | | Average particle size d1 (μm) | Amount W1 (wt %) | Average particle size d2 (μm) | Amount W2 (wt %) | | Firing Temp. (° C.) |
| Sample No. | Kind | Amount (wt %) | | | | | d1/d2 | W1:W2 | |
| *1 | ① | 50 | 5.0 | 45 | — | — | — | — | 950 |
| *2 | ① | 50 | — | — | 2.5 | 45 | — | — | 950 |
| *3 | ① | 50 | — | — | 1.0 | 45 | — | — | 950 |
| 4 | ① | 50 | 5.0 | 44.0 | 2.5 | 1.0 | 2 | 98:2 | 950 |
| 5 | ① | 50 | 5.0 | 42.5 | 2.5 | 2.5 | 2 | 94:6 | 920 |
| 6 | ① | 50 | 5.0 | 40.0 | 2.5 | 5.0 | 2 | 89:11 | 920 |
| 7 | ① | 50 | 5.0 | 35.0 | 2.5 | 10.0 | 2 | 78:22 | 920 |
| 8 | ① | 50 | 5.0 | 30.0 | 2.5 | 15.0 | 2 | 67:33 | 920 |
| 9 | ① | 50 | 5.0 | 25.0 | 2.5 | 20.0 | 2 | 56:44 | 920 |
| 10 | ① | 50 | 5.0 | 42.5 | 1.0 | 2.5 | 5 | 94:6 | 920 |
| 11 | ① | 50 | 5.0 | 40.0 | 1.0 | 5.0 | 5 | 89:11 | 920 |
| 12 | ① | 50 | 5.0 | 35.0 | 1.0 | 10.0 | 5 | 78:22 | 920 |
| 13 | ① | 50 | 5.0 | 30.0 | 1.0 | 15.0 | 5 | 67:33 | 920 |
| 14 | ① | 50 | 5.0 | 25.0 | 1.0 | 20.0 | 5 | 56:44 | 920 |
| *15 | ① | 50 | 3.5 | 35.0 | 2.5 | 10.0 | 1.4 | 78:22 | 920 |
| 16 | ① | 50 | 3.0 | 35.0 | 1.0 | 10.0 | 3 | 78:22 | 920 |
| 17 | ① | 50 | 6.0 | 35.0 | 1.0 | 10.0 | 6 | 78:22 | 920 |
| *18 | 2 | 50 | 7.0 | 35.0 | 1.0 | 10.0 | 7 | 78:22 | 920 |
| 19 | 2 | 50 | 3.0 | 35.0 | 1.0 | 10.0 | 3 | 78:22 | 920 |
| 20 | 2 | 50 | 5.0 | 40.0 | 1.0 | 5.0 | 5 | 89:11 | 920 |
| 21 | 2 | 50 | 6.0 | 35.0 | 1.0 | 10.0 | 6 | 78:22 | 920 |
| 22 | 2 | 50 | 5.0 | 35.0 | 1.0 (2.5) | 5.0 5.0 | 5 | 78:22 | 920 |
| *22 | 2 | 65 | 5.0 | 22.0 | 1.0 | 8.0 | 5 | 73:27 | 920 |

*Samples outside the scope of the invention.
**$ZrO_2$ is further added in an amount of 5% by weight as a filler.

TABLE 10

| Sample No. | Relative Density (%) | Firing-possible temperature range | $SiO_2$ particle size distribution*** | | | Coefficient of thermal expansion (ppm/° C.) |
|---|---|---|---|---|---|---|
| | | | D1 | D2 | D1/D2 | |
| 1 | 87 | none | 5.5 | — | — | — |
| 2 | 90 | 950–960 | — | 2.8 | — | 11.3 |
| 3 | 90 | 950–960 | — | 1.3 | — | 11.2 |
| 4 | 90 | 940–960 | 5.5 | 2.8 | 2.0 | 11.2 |
| 5 | 95 | 920–950 | 5.5 | 2.8 | 2.0 | 11.2 |
| 6 | 96 | 920–950 | 5.5 | 2.8 | 2.0 | 11.5 |
| 7 | 98 | 920–960 | 5.5 | 2.8 | 2.0 | 11.5 |
| 8 | 98 | 920–960 | 5.5 | 2.8 | 2.0 | 11.5 |
| 9 | 98 | 920–960 | 5.5 | 2.8 | 2.0 | 11.5 |
| 10 | 93 | 920–950 | 5.5 | 1.3 | 4.2 | 11.4 |
| 11 | 94 | 920–950 | 5.5 | 1.3 | 4.2 | 11.4 |
| 12 | 96 | 920–960 | 5.5 | 1.3 | 4.2 | 11.4 |
| 13 | 96 | 920–960 | 5.5 | 1.3 | 4.2 | 11.4 |
| 14 | 96 | 920–960 | 5.5 | 1.3 | 4.2 | 11.4 |
| 15 | 85 | none | 3.8 | 2.8 | 1.4 | — |
| 16 | 94 | 920–960 | 3.3 | 1.3 | 2.5 | 11.5 |
| 17 | 94 | 920–960 | 5.6 | 1.3 | 5.1 | 11.5 |
| 18 | 87 | none | 7.9 | 1.2 | 6.6 | — |
| 19 | 93 | 920–960 | 3.6 | 1.2 | 3.0 | 12.5 |

TABLE 10-continued

| Sample No. | Relative Density (%) | Firing-possible temperature range | SiO$_2$ particle size distribution*** | | | Coefficient of thermal expansion (ppm/°C.) |
|---|---|---|---|---|---|---|
| | | | D1 | D2 | D1/D2 | |
| 20 | 94 | 920–960 | 5.8 | 1.2 | 4.8 | 12.5 |
| 21 | 94 | 920–960 | 6.8 | 1.2 | 5.7 | 12.5 |
| 22 | 95 | 920–960 | 5.8 | 1.2 (2.7) | 4.8 | 12.4 |
| 23 | 93 | 920–950 | 5.6 | 4.3 | 1.3 | 6.0 |

D1 is a peak position on the most coarse side,
D2 is a peak position on the finest side.

As will be obvious from Tables 9 and 10, a densely sintered product cannot be obtained with the sample No. 1 using none of two or more kinds of SiO$_2$ having different average particle diameters. By using the samples Nos. 2 and 3, densely sintered products can be obtained having, however, a firing-possible temperature range of as narrow as 10° C. and bringing about disadvantage concerning dimensional stability of the products and matching of sintering between the sintered product and the metallization when the metallization is co-fired.

On the other hand, sufficiently densely sintered products can be obtained with the samples Nos. 4 to 14, 16, 17 and 19 to 22 using two or more kinds of SiO$_2$ powders having different average diameters. In this case, the firing-possible temperature ranges are as wide as from 20 to 40° C. offering great advantage concerning dimensional stability of the products and matching of sintering between the sintered product and the metallization when the metallization is co-fired.

With the samples Nos. 15 and 16 having the ratios d1/d2 and D1/D2 lying outside the range of 2 to 6, however, the sintered products having relative densities of not smaller than 90% could not be obtained.

With the sample No. 23 using the glass 4 containing BaO in an amount of smaller than 5% by weight, the product exhibits a high softening point (yield point) and cannot be sintered unless the glass is added in large amounts. Besides, the obtained sintered product exhibits a coefficient of thermal expansion of as low as 6 ppm/°C.

With the samples to which ZrO$_2$ is added of Tables 9 and 10, no change occurs on the surface even after the testing, and excellent resistance is exhibited against the chemicals. Further, the testing was conducted in the case when no ZrO$_2$ was added. It was learned that the glass phase had been missing from the surface after the testing, and the resistance against the chemicals was poor.

In the heat cycle testing, the samples having a coefficient of thermal expansion of not smaller than 8.5 ppm/° C. all provided an excellent mounting structure without any change even after the heat cycle of 2000 times. With the sample No. 23 having a coefficient of thermal expansion of lower than 8.5 ppm/°C., however, the resistance has changed after 200 cycles, and the mounting reliability was low.

What is claimed is:

1. A high-thermal-expansion glass ceramic sintered product comprising:

(A) a glass phase containing BaO in an amount of from 5 to 60% by weight; and wherein said sintered product contains:

(C) a Zr element in an amount of from 0.1 to 30% by weight calculated wherein said sintered product as ZrO$_2$, and has a coefficient of linear thermal expansion at 40 to 400° C. of from 8.5 to 18 ppm/°C. and exhibits a curve of coefficients of linear thermal expansion without a point of inflection over a region of from 40° C. to 400° C.

2. The glass ceramic sintered product according to claim 1, wherein said Zr element is partly or wholly melted in said glass phase.

3. The glass ceramic sintered product according to claim 1, which does not substantially contain cristobalite.

4. The glass ceramic sintered product according claim 3, wherein said glass phase contains BaO in an amount of from 5 to 60% by weight, Al$_2$O$_3$ in an amount of from 1 to 10% by weight, and SiO$_2$ in an amount of from 25 to 60% by weight.

5. The glass ceramic sintered product according to claim 1, wherein a curve of particle size distribution of said quartz particles in the sintered product includes at least two peaks over a range of from 0.5 to 6 μm, and when the position of a peak on the most coarse side is denoted by D1 (μm) and the position of a peak on the finest side by D2 (μm), a ratio D1/D2 lies within a range of from 2 to 6.

* * * * *